(12) United States Patent
Yoon et al.

(10) Patent No.: US 12,218,065 B2
(45) Date of Patent: Feb. 4, 2025

(54) SEMICONDUCTOR PACKAGE INCLUDING ADHESIVE LAYER AND METHOD FOR MANUFACTURING THE SAME

(71) Applicant: Samsung Electronics Co., Ltd., Suwon-si (KR)

(72) Inventors: Yeohoon Yoon, Yongin-si (KR); Ilho Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 214 days.

(21) Appl. No.: 17/697,243

(22) Filed: Mar. 17, 2022

(65) Prior Publication Data

US 2023/0072616 A1   Mar. 9, 2023

(30) Foreign Application Priority Data

Sep. 6, 2021 (KR) .......................... 10-2021-0118350

(51) Int. Cl.
*H01L 23/538* (2006.01)
*H01L 23/00* (2006.01)
*H01L 23/31* (2006.01)

(52) U.S. Cl.
CPC ...... *H01L 23/5383* (2013.01); *H01L 23/3107* (2013.01); *H01L 24/14* (2013.01); *H01L 24/16* (2013.01); *H01L 24/32* (2013.01); *H01L 24/73* (2013.01); *H01L 2224/14181* (2013.01); *H01L 2224/16146* (2013.01); *H01L 2224/16227* (2013.01); *H01L 2224/32145* (2013.01); *H01L 2224/32155* (2013.01); *H01L 2224/73204* (2013.01)

(58) Field of Classification Search
None
See application file for complete search history.

(56) References Cited

U.S. PATENT DOCUMENTS

| | | | |
|---|---|---|---|
| 9,343,432 B2 | 5/2016 | Lee et al. | |
| 9,853,012 B2 | 12/2017 | Chung et al. | |
| 9,978,694 B2* | 5/2018 | Cho | H01L 25/50 |
| 10,026,724 B2 | 7/2018 | Kim et al. | |
| 10,153,255 B2 | 12/2018 | Hwang et al. | |
| 10,354,985 B2 | 7/2019 | Chang et al. | |
| 10,622,335 B2* | 4/2020 | Hwang | H01L 25/0655 |
| 10,923,465 B2* | 2/2021 | Chang | H01L 25/0657 |
| 10,930,613 B2* | 2/2021 | Park | H01L 24/73 |
| 11,551,996 B2* | 1/2023 | Choi | H01L 25/0652 |
| 11,935,868 B2* | 3/2024 | Lee | H01L 25/0657 |
| 2014/0295620 A1 | 10/2014 | Ito et al. | |
| 2018/0286835 A1 | 10/2018 | Nah | |
| 2023/0063147 A1* | 3/2023 | Yu | H01L 25/18 |

* cited by examiner

*Primary Examiner* — Long Pham
(74) *Attorney, Agent, or Firm* — HARNESS, DICKEY & PIERCE, P.L.C.

(57) ABSTRACT

A semiconductor package may include a first semiconductor chip, a second semiconductor chip spaced apart from the first semiconductor chip, an adhesive layer including an interposition portion and a side portion, and a molding layer. The molding layer may surround the first semiconductor chip, the second semiconductor chip, and the adhesive layer. The interposition portion may be between the first and second semiconductor chips. The side portion may contact a side surface of the first semiconductor chip and a side surface of the second semiconductor chip. A top surface of the side portion is curved, and an outer side surface of the side portion is flat.

19 Claims, 12 Drawing Sheets

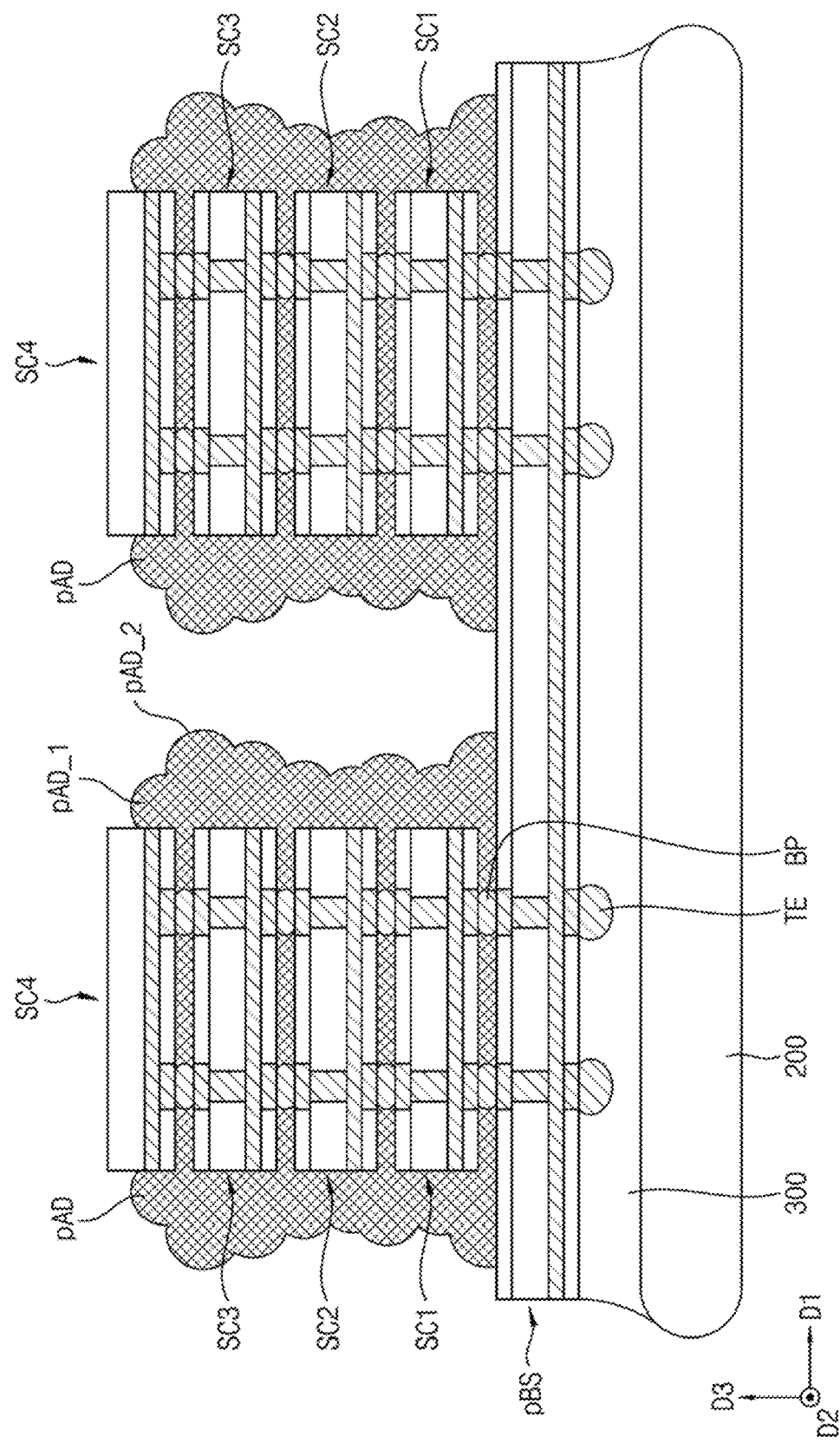

SEMICONDUCTOR PACKAGE INCLUDING ADHESIVE LAYER AND METHOD FOR MANUFACTURING THE SAME

CROSS-REFERENCE TO THE RELATED APPLICATION

This application claims priority from Korean Patent Application No. 10-2021-0118350, filed on Sep. 6, 2021 in the Korean Intellectual Property Office, the disclosure of which is incorporated herein by reference in its entirety.

BACKGROUND

1. Field

Example embodiments relate to a semiconductor package and/or a method for manufacturing the same. More particularly, example embodiments relate to a semiconductor package including an adhesive layer and/or a method for manufacturing the same.

2. Description of the Related Art

In accordance with advances in electronic industries and user demand, electronic appliances are being further miniaturized and lightened, and semiconductor packages used in such electronic appliances may be required to achieve high performance and a large capacity as well as miniaturization and lightness. In order to achieve high performance and a large capacity as well as miniaturization and lightness in such semiconductor packages, research and development is being conducted on a semiconductor package in which semiconductor chips are stacked.

SUMMARY

Example embodiments provide a semiconductor package having enhanced reliability.

A semiconductor package according to an example embodiment may include a first semiconductor chip; a second semiconductor chip spaced apart from the first semiconductor chip; an adhesive layer including an interposition portion and a side portion, the interposition portion between the first semiconductor chip and the second semiconductor chip, and the side portion contacting a side surface of the first semiconductor chip and a side surface of the second semiconductor chip; and a molding layer surrounding the first semiconductor chip, the second semiconductor chip, and the adhesive layer. A top surface of the side portion may be curved, and an outer side surface of the side portion may be flat.

A semiconductor package according to an example embodiment may include a base structure; a first bump connected to the base structure; a first semiconductor chip connected to the first bump; an adhesive layer including a first interposition portion and a side portion, the first interposition portion between the base structure and the first semiconductor chip, and the side portion contacting a top surface of the base structure and a side surface of the first semiconductor chip; and a molding layer surrounding the base structure, the first semiconductor chip, and the adhesive layer. A level of a bottom surface of the molding layer may be equal to a level of a bottom surface of the base structure.

A semiconductor package according to an example embodiment may include semiconductor chips overlapping each other, an adhesive layer including interposition portions and a side portion, and a molding layer surrounding the semiconductor chips and the adhesive layer. The interposition portions may be between the semiconductor chips. The side portion may be connected to the interposition portions. The semiconductor chips may include an uppermost semiconductor chip. A level of a top surface of the side portion of the adhesive layer may gradually increase as the top surface of the side portion extends from a side surface of the uppermost semiconductor chip to an uppermost portion of the side portion.

BRIEF DESCRIPTION OF THE DRAWINGS

FIGS. 2A, 2B, 2C, 2D, 2E and 2F are sectional views explaining a method for manufacturing a semiconductor package in accordance with some example embodiments.

DETAILED DESCRIPTION OF EXAMPLE EMBODIMENTS

Figure 1A:
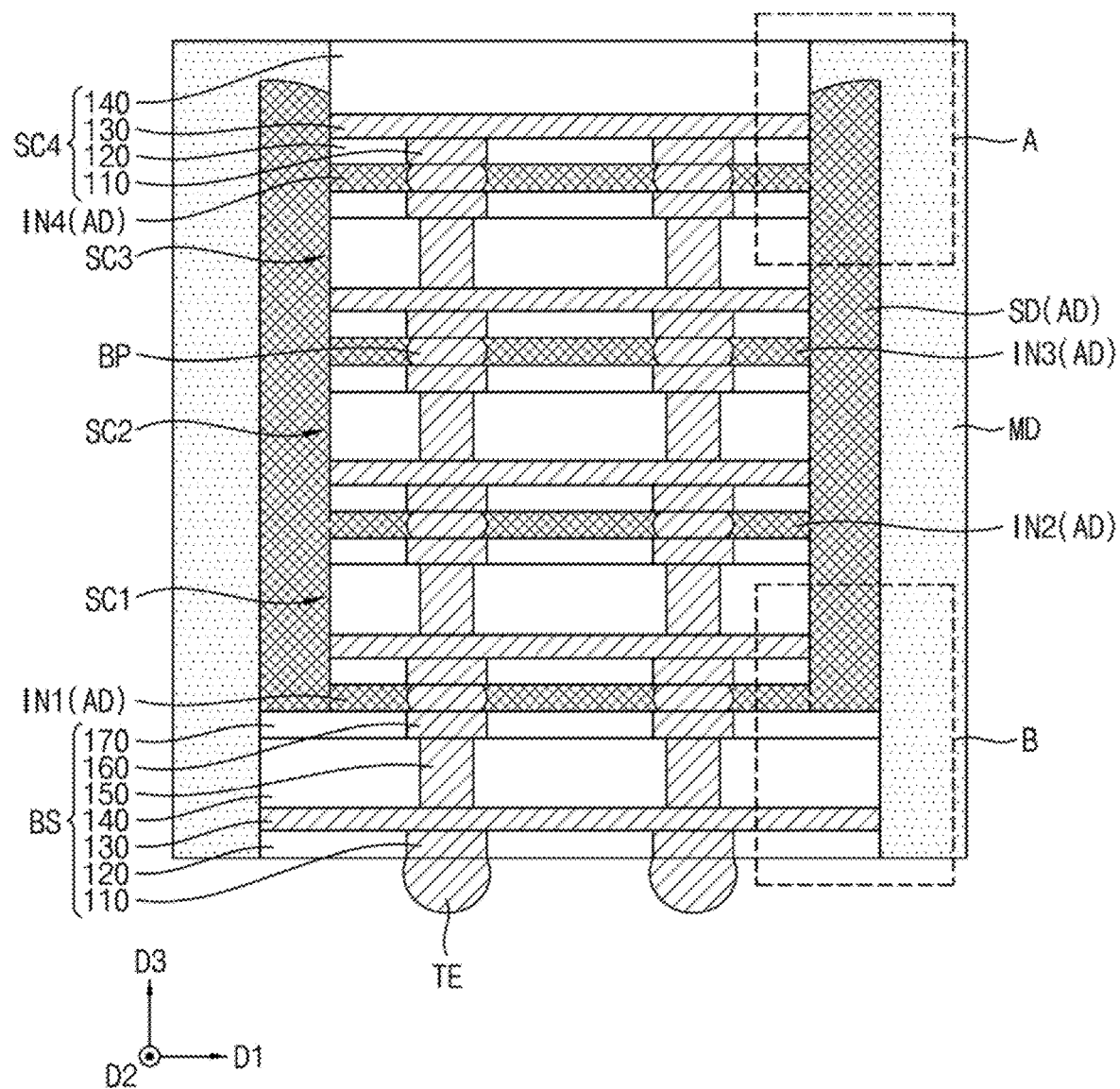
FIG. 1A is a sectional view of a semiconductor package according to some example embodiments.
Figure 1B:
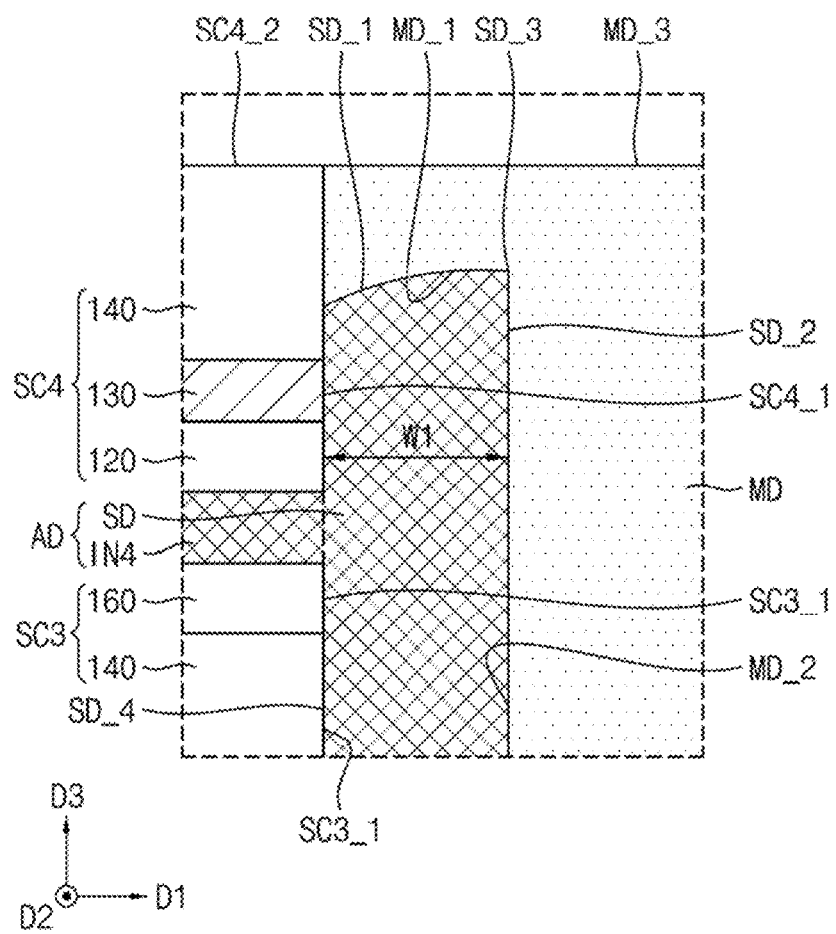
FIG. 1B is an enlarged view of a portion A of FIG. 1A.
Figure 1C:
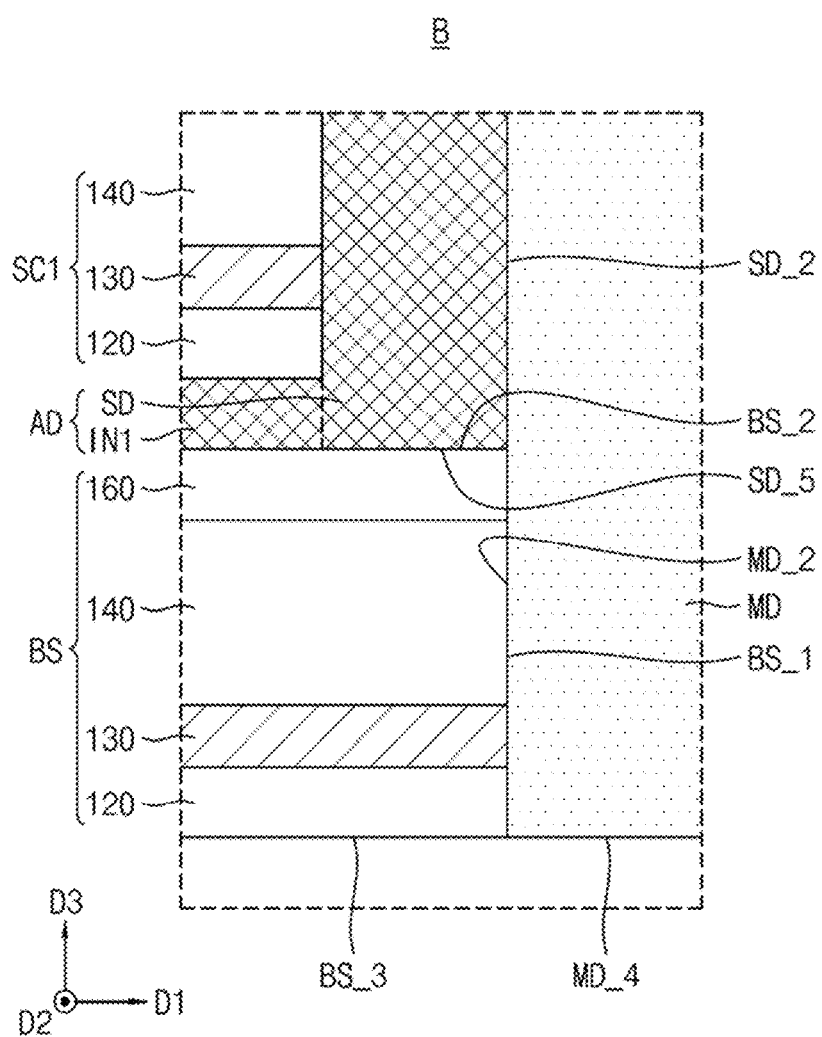
FIG. 1C is an enlarged view of a portion B of FIG. 1A.

FIG. 1A is a sectional view of a semiconductor package according to some example embodiments. FIG. 1B is an enlarged view of a portion A of FIG. 1A. FIG. 1C is an enlarged view of a portion B of FIG. 1A.

Referring to FIG. 1A, the semiconductor package may include a base structure BS. The base structure BS may include lower pads 110, a lower protective layer 120, a wiring layer 130, a substrate 140, through vias 150, upper pads 160, and an upper protective layer 170.

The substrate 140 may have the form of a plate extending along a plane defined by a first direction D1 and a second direction D2. The first direction D1 and the second direction D2 may intersect each other. For example, the first direction D1 and the second direction D2 may perpendicularly intersect each other. In some embodiments, the substrate 140 may be a semiconductor substrate. For example, the substrate 140 may include silicon, germanium, silicon-germanium, GaP, or GaAs. In some embodiments, the substrate 140 may be a silicon-on-insulator (SOI) substrate or a germanium-on-insulator (GOI) substrate.

The substrate 140 may be provided on the wiring layer 130. The wiring layer 130 may be provided under the substrate 140. The wiring layer 130 may include wirings, and an insulating layer surrounding the wirings. The wirings of the wiring layer 130 may include a conductive material. For example, semiconductor devices such as a memory device or a logic device may be provided between the substrate 140 and the wiring layer 130. The wirings of the wiring layer 130 may be electrically connected to the semiconductor devices.

The wiring layer 130 may be provided on the lower protective layer 120. The lower protective layer 120 may be provided under the wiring layer 130. The lower protective layer 120 may function to protect the wiring layer 130. The lower protective layer 120 may cover a bottom surface of the wiring layer 130. The lower protective layer 120 may include an insulating material.

The upper protective layer 170 may be provided on the substrate 140. The upper protective layer 170 may function to protect the substrate 140. The upper protective layer 170 may cover a top surface of the substrate 140. The upper protective layer 170 may include an insulating material.

The through via 150 may be electrically connected to the wiring of the wiring layer 130 while extending through the substrate 140. The through via 150 may include a conductive material.

The lower pads 110 may be surrounded by the lower protective layer 120. The lower pad 110 may be electrically connected to the wiring of the wiring layer 130. The lower pads 110 may include a conductive material.

The upper pads 160 may be surrounded by the upper protective layer 170. The upper pad 160 may be connected to the through via 150. The upper pads 160 may include a conductive material.

Although the base structure BS has been shown and described as including the lower pads 110, the lower protective layer 120, the wiring layer 130, the substrate 140, the through vias 150, the upper pads 160, and the upper protective layer 170, the structure of the base structure BS is not limited thereto. In some embodiments, the base structure BS may be a semiconductor chip structure including semiconductor devices. In some embodiments, the base structure BS may be an interposer.

Terminals TE may be provided under the base structure BS. The terminal TE may be connected to the lower pad 110 of the base structure BS. The terminals TE may include a conductive material.

A first semiconductor chip SC1, a second semiconductor chip SC2, a third semiconductor chip SC3, and a fourth semiconductor chip SC4 may be sequentially provided over the base structure BS. The base structure BS, the first semiconductor chip SC1, the second semiconductor chip SC2, the third semiconductor chip SC3, and the fourth semiconductor chip SC4 may be sequentially arranged in a third direction D3. The base structure BS and the first to fourth semiconductor chips SC1, SC2, SC3 and SC4 may overlap each other in the third direction D3. The third direction D3 may intersect the first direction D1 and the second direction D2. For example, the third direction D3 may perpendicularly intersect the first direction D1 and the second direction D2. For example, the first direction D1 and the second direction D2 may be horizontal directions, and the third direction D3 may be a vertical direction. The fourth semiconductor chip SC4 may be an uppermost semiconductor chip.

The base structure BS and the first semiconductor chip SC1 may be spaced apart from each other in the third direction D3. The first semiconductor chip SC1 and the second semiconductor chip SC2 may be spaced apart from each other in the third direction D3. The second semiconductor chip SC2 and the third semiconductor chip SC3 may be spaced apart from each other in the third direction D3. The third semiconductor chip SC3 and the fourth semiconductor chip SC4 may be spaced apart from each other in the third direction.

Each of the first to fourth semiconductor chips SC1, SC2, SC3 and SC4 may include, for example, semiconductor devices such as a memory device or a logic device. The number of semiconductor chips SC1, SC2, SC3 and SC4 included in the semiconductor package is not limited to four.

Similar to the base structure BS, the first to third semiconductor chips SC1, SC2 and SC3 may include lower pads 110, a lower protective layer 120, a wiring layer 130, a substrate 140, through vias 150, upper pads 160, and an upper protective layer 170. However, the structure of the first to third semiconductor chips SC1, SC2 and SC3 is not limited to the above-described structure. The fourth semiconductor chip SC4 may include lower pads 110, a lower protective layer 120, a wiring layer 130, and a substrate 140. However, the structure of the fourth semiconductor chip SC4 is not limited to the above-described structure.

The width of the base structure BS in the first direction D1 may be greater than the widths of the first to fourth semiconductor chips SC1, SC2, SC3 and SC4 in the first direction D1.

Bumps BP may be provided. The bumps BP may be provided between the base structure BS and the first semiconductor chip SC1, between the first and second semiconductor chips SC1 and SC2, between the second and third semiconductor chips SC2 and SC3, or between the third and fourth semiconductor chips SC3 and SC4. The bumps BP may be connected to the base structure BS and the first to fourth semiconductor chips SC1, SC2, SC3 and SC4. The bumps BP may be connected to the lower pads 110 and, as such, may electrically interconnect the base structure BS and the first to fourth semiconductor chips SC1, SC2, SC3 and SC4. The bumps BP may include a conductive material.

An adhesive layer AD may be provided over the base structure BS. The adhesive layer AD may bond the first to fourth semiconductor chips SC1, SC2, SC3 and SC4 and the base structure BS to one another. The adhesive layer AD may include a first interposition portion IN1 interposed between the base structure BS and the first semiconductor chip SC1, a second interposition portion IN2 interposed between the first and second semiconductor chips SC1 and SC2, a third interposition portion IN3 interposed between the second and third semiconductor chips SC2 and SC3, a fourth interposition portion IN4 interposed between the third and fourth semiconductor chips SC3 and SC4, and a side portion SD connected to the first to fourth interposition portions IN1, IN2, IN3 and IN4. Although the first to fourth interposition portions IN1, IN2, IN3 and IN4 and the side portion SD of the adhesive layer AD are described as being divided from one another, for convenience of description, the first to fourth interposition portions IN1, IN2, IN3 and IN4 and the side portion SD of the adhesive layer AD may be interconnected without having any boundary and, as such, may have an integrated structure. The number of interposition portions IN1, IN2, IN3 and IN4 included in the adhesive layer AD is not limited to four.

The first to fourth interposition portions IN1, IN2, IN3 and IN4 may be portions overlapping with the first to fourth semiconductor chips SC1, SC2, SC3 and SC4 in the third direction D3. The side portion SD may be a portion not overlapping with the first to fourth semiconductor chips SC1, SC2, SC3 and SC4 in the third direction D3. The side portion SD may contact side surfaces of the first to fourth semiconductor chips SC1, SC2, SC3 and SC4. In some embodiments, the adhesive layer AD may include two side portions SD disposed at opposite sides of the first to fourth semiconductor chips SC1, SC2, SC3 and SC4. In some embodiments, the adhesive layer AD may include one side portion SD surrounding the first to fourth semiconductor chips SC1, SC2, SC3 and SC4.

The adhesive layer AD may include an adhesive polymer material. For example, the adhesive layer AD may include a non-conductive film (NCF).

A molding layer MD surrounding the base structure BS, the first to fourth semiconductor chips SC1, SC2, SC3 and SC4 and the adhesive layer AD may be provided. The molding layer MD may cover the base structure BS, the first to fourth semiconductor chips SC1, SC2, SC3 and SC4 and the adhesive layer AD. The molding layer MD may expose a top surface of the fourth semiconductor chip SC4.

The molding layer MD may include a polymer material. For example, the molding layer MD may include an epoxy molding compound (EMC). The coefficient of thermal expansion (CTE) of the molding layer MD may be different from the coefficient of thermal expansion of the adhesive layer AD. The coefficient of thermal expansion of the molding layer MD may be lower than the coefficient of thermal expansion of the adhesive layer AD. For example, the coefficient of thermal expansion of the molding layer MD may be 10 to 15 ppm/° C., and the coefficient of thermal expansion of the adhesive layer AD may be 35 to 40 ppm/° C.

Referring to FIG. 1B, a top surface SD_1 of the side portion SD of the adhesive layer AD may be curved. The top surface SD_1 of the side portion SD may contact a side surface SC4_1 of the fourth semiconductor chip SC4. The molding layer MD may include a curved surface MD_1 contacting the top surface SD_1 of the side portion SD. The curved surface MD_1 of the molding layer MD may be curved to correspond to the top surface SD_1 of the side portion SD.

An outer side surface SD_2 of the side portion SD of the adhesive layer AD may extend in the third direction D3. For example, the outer side surface SD_2 of the side portion SD may extend in the vertical direction. The outer side surface SD_2 of the side portion SD may be flat. The level of the top surface SD_1 of the side portion SD may gradually increase as the top surface SD_1 extends from the side surface SC4_1 of the fourth semiconductor chip SC4 to the outer side surface SD_2 of the side portion SD. A portion of the side portion SD, where the top surface SD_1 and the outer side surface SD_2 of the side portion SD intersect, may be an uppermost portion SD_3 of the side portion SD. The level of the top surface SD_1 of the side portion SD may gradually increase as the top surface SD_1 extends from the side surface SC4_1 of the fourth semiconductor chip SC4 to the uppermost portion SD_3 of the side portion SD. The uppermost portion SD_3 of the side portion SD may be spaced apart from the side surface SC4_1 of the fourth semiconductor chip SC4. The molding layer MD may include an inner side surface MD_2 contacting the outer side surface SD_2 of the side portion SD. The inner side surface MD_2 of the molding layer MD may extend in the third direction D3. For example, the inner side surface MD_2 of the molding layer MD may extend in the vertical direction. The inner side surface MD_2 of the molding layer MD may be flat.

A top surface MD_3 of the molding layer MD may be coplanar with a top surface SC4_2 of the fourth semiconductor chip SC4. The level of the top surface MD_3 of the molding layer MD may be equal to the level of the top surface SC4_2 of the fourth semiconductor chip SC4.

The width of the side portion SD of the adhesive layer AD in the first direction D1 may be defined as a first width W1. The distance in the first direction D1 between the outer side surface SD_2 of the side portion SD and the side surface of each of the first to fourth semiconductor chips SC1, SC2, SC3 and SC4 may be equal to the first width W1. For example, the distance in the first direction D1 between the side surface SC4_1 of the fourth semiconductor chip SC4 and the outer side surface SD_2 of the side portion SD may be equal to the first width W1, and the distance in the first direction D1 between a side surface SC3_1 of the third semiconductor chip SC3 and the outer side surface SD_2 of the side portion SD may be equal to the first width W1. For example, the first width W1 may be 50 μm.

The distance in the first direction D1 between the inner side surface MD_2 of the molding layer MD and the side surface of each of the first to fourth semiconductor chips SC1, SC2, SC3 and SC4 may be equal to the first width W1. For example, the distance in the first direction D1 between the side surface SC4_1 of the fourth semiconductor chip SC4 and the inner side surface MD 2 of the molding layer MD may be equal to the first width W1, and the distance in the first direction D1 between the side surface SC3_1 of the third semiconductor chip SC3 and the inner side surface MD_2 of the molding layer MD may be equal to the first width W1.

The width of the base structure BS in the first direction D1 may be equal to a value obtained by adding double the first width W1 to the width in the first direction D1 of any one of the first to fourth semiconductor chips SC1, SC2, SC3 and SC4.

The inner side surface SD_4 of the side portion SD of the adhesive layer AD may contact the side surfaces of the first to fourth semiconductor chips SC1, SC2, SC3 and SC4. For example, the inner side surface SD_4 of the side portion SD may contact the side surface SC4_1 of the fourth semiconductor chip SC4 and the side surface SC3_1 of the third semiconductor chip SC3. The first to fourth interposition portions IN1, IN2, IN3 and IN4 of the adhesive layer AD may be connected to the inner side surface SD_4 of the side portion SD.

Referring to FIG. 1C, the inner side surface MD_2 of the molding layer MD may contact a side surface BS_1 of the base structure BS. The entire the side surface BS_1 of the base structure BS may contact the inner side surface MD_2 of the molding layer MD.

The outer side surface SD_2 of the side portion SD may be coplanar with the side surface BS_1 of the base structure BS. The outer side surface SD_2 of the side portion SD may overlap with the side surface BS_1 of the base structure BS in the third direction D3.

An outer portion BS_2 of the top surface of the base structure BS contacting a bottom surface SD_5 of the side portion SD may be defined. The side portion SD may overlap with the outer portion BS_2 of the top surface of the base structure BS in the third direction D3. The entirety of the outer portion BS_2 of the top surface of the base structure BS may contact the bottom surface SD_5 of the side portion SD. The outer portion BS_2 of the top surface of the base structure BS may be a portion connected to the side surface BS_1 of the base structure BS. The outer portion BS_2 of the top surface of the base structure BS may be a portion of the top surface of the base structure BS defined at an outermost side.

A triple point, at which the side portion SD of the adhesive layer AD, the molding layer MD and the base structure BS are in contact, may be a point at which the outer surface SD_2 and the bottom surface SD_5 of the side portion SD are interconnected, and may be a point at which the side surface BS_1 and the outer portion BS_2 of the top surface of the base structure BS are interconnected.

The bottom surface MD_4 of the molding layer MD may be coplanar with a bottom surface BS_3 of the base structure BS. The bottom surface MD_4 of the molding layer MD may overlap with the bottom surface BS_3 of the base structure BS in the first direction D1 The level of the bottom surface MD_4 of the molding layer MD may be equal to the level of the bottom surface BS_3 of the base structure BS.

In the semiconductor package according to example embodiments, the width of the side portion SD of the adhesive layer AD may be relatively small. Accordingly, the size of the adhesive layer AD, which has a relatively high coefficient of thermal expansion, may be relatively small and, as such, warpage caused by thermal expansion may be minimized.

In the semiconductor package according to some example embodiments, the triple point, at which the molding layer MD, the adhesive layer AD and the base structure BS are in contact, may be disposed between the outer portion BS_2 of the top surface of the base structure BS and the side surface BS_1 of the base structure BS. Accordingly, even when torsion is generated at the semiconductor package, no stress may be concentrated at the triple point and, as such, formation of a crack among the molding layer MD, the adhesive layer AD and the base structure BS may be limited and/or prevented.

FIGS. 2A, 2B, 2C, 2D, 2E and 2F are sectional views explaining a method for manufacturing a semiconductor package in accordance with some example embodiments.

Referring to FIG. 2A, a first glue layer 300 may be formed on a first carrier substrate 200, and a preliminary base structure pBS may be attached to the first glue layer 300. The preliminary base structure pBS may include lower pads, a lower protective layer, a wiring layer, a substrate, through vias, upper pads, and an upper protective layer. Terminals TE connected to the preliminary base structure pBS may be formed before attachment of the preliminary base structure pBS to the first glue layer 300. For example, the first glue layer 300 may include an acrylic polymer.

First semiconductor chips SC1, second semiconductor chips SC2, third semiconductor chips SC3, fourth semiconductor chips SC4, bumps BP, and preliminary adhesive layers pAD may be formed over the preliminary base structure pBS. First partial adhesive layers (not shown) may be respectively formed under the first semiconductor chips SC1, to which bumps BP are connected, and the first partial adhesive layers may then be attached to the preliminary base structure pBS. Second partial adhesive layers (not shown) may be respectively formed under the second semiconductor chips SC2, to which bumps BP are connected, and the second partial adhesive layers may then be attached to the first semiconductor chips SC1, respectively. Third partial adhesive layers (not shown) may be respectively formed under the third semiconductor chips SC3, to which bumps BP are connected, and the third partial adhesive layers may then be attached to the second semiconductor chips SC2, respectively. Fourth partial adhesive layers (not shown) may be respectively formed under the fourth semiconductor chips SC4, to which bumps BP are connected, and the fourth partial adhesive layers may then be attached to the third semiconductor chips SC3, respectively.

In an attachment process of the first to fourth partial adhesive layers, the shapes of the first to fourth partial adhesive layers may be deformed and, as such, the first to fourth partial adhesive layers may be merged. A merged structure of the first to fourth partial adhesive layers may be defined as a preliminary adhesive layer pAD. The preliminary adhesive layer pAD may be curved at a top surface pAD_1 and an outer side surface pAD_2 thereof.

Figure 2B:
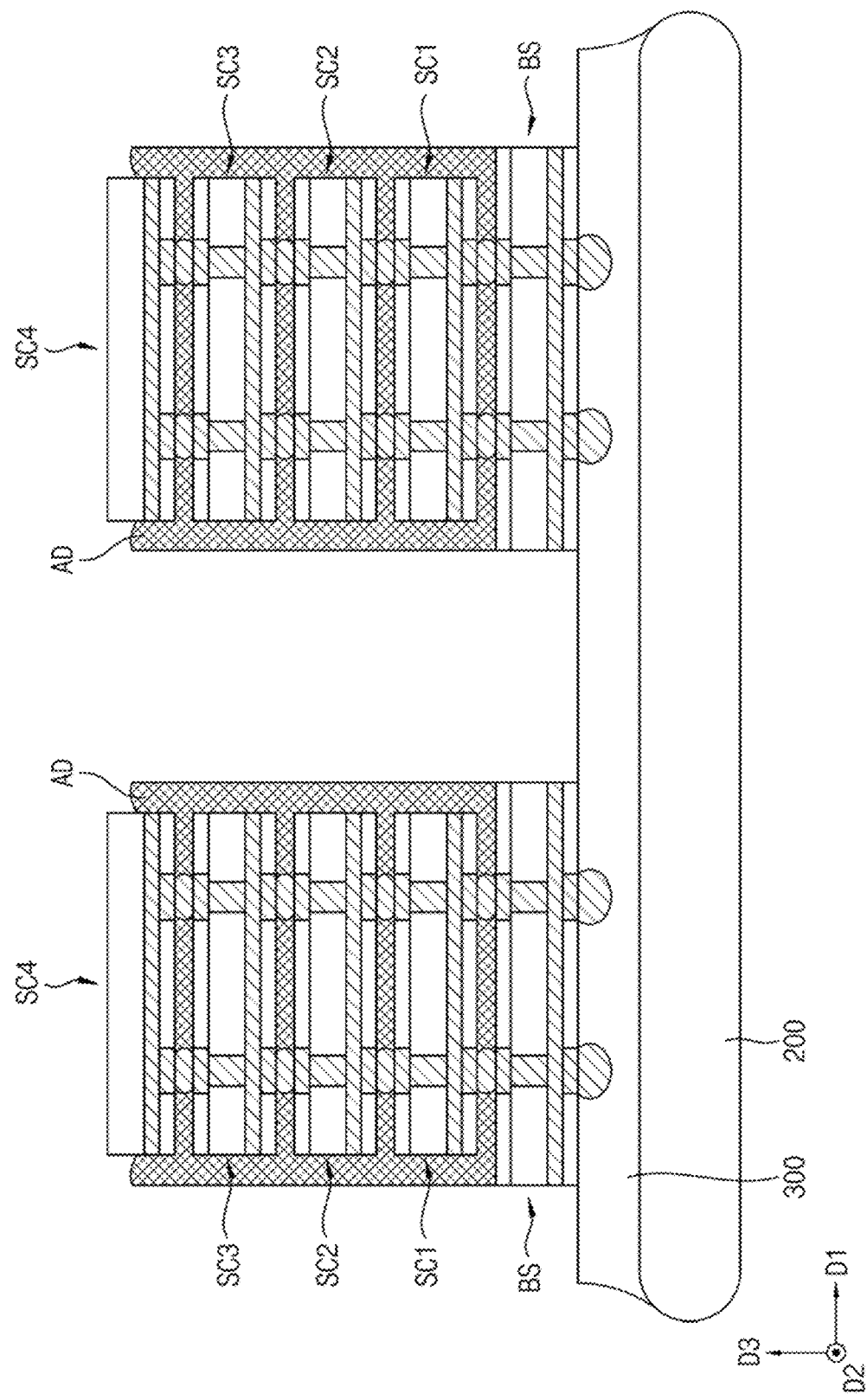

Referring to FIG. 2B, a first sawing process may be performed. For example, the first sawing process may be a blade sawing process. The first sawing process may include cutting the preliminary adhesive layers pAD and the preliminary base structure pBS. The preliminary adhesive layer pAD and the preliminary base structure pBS may be simultaneously cut through one process.

As the preliminary adhesive layers pAD are cut, adhesive layers AD may be formed. Outer side surfaces of the adhesive layers AD may be flat. As the preliminary base structure pBS is cut, base structures BS may be formed. The preliminary base structure pBS may be separated into a plurality of base structures BS. The preliminary adhesive layer pAD and the preliminary base structure pBS may be cut such that the outer side surface of the adhesive layer AD is coplanar with a side surface of the base structure BS.

Figure 2C:
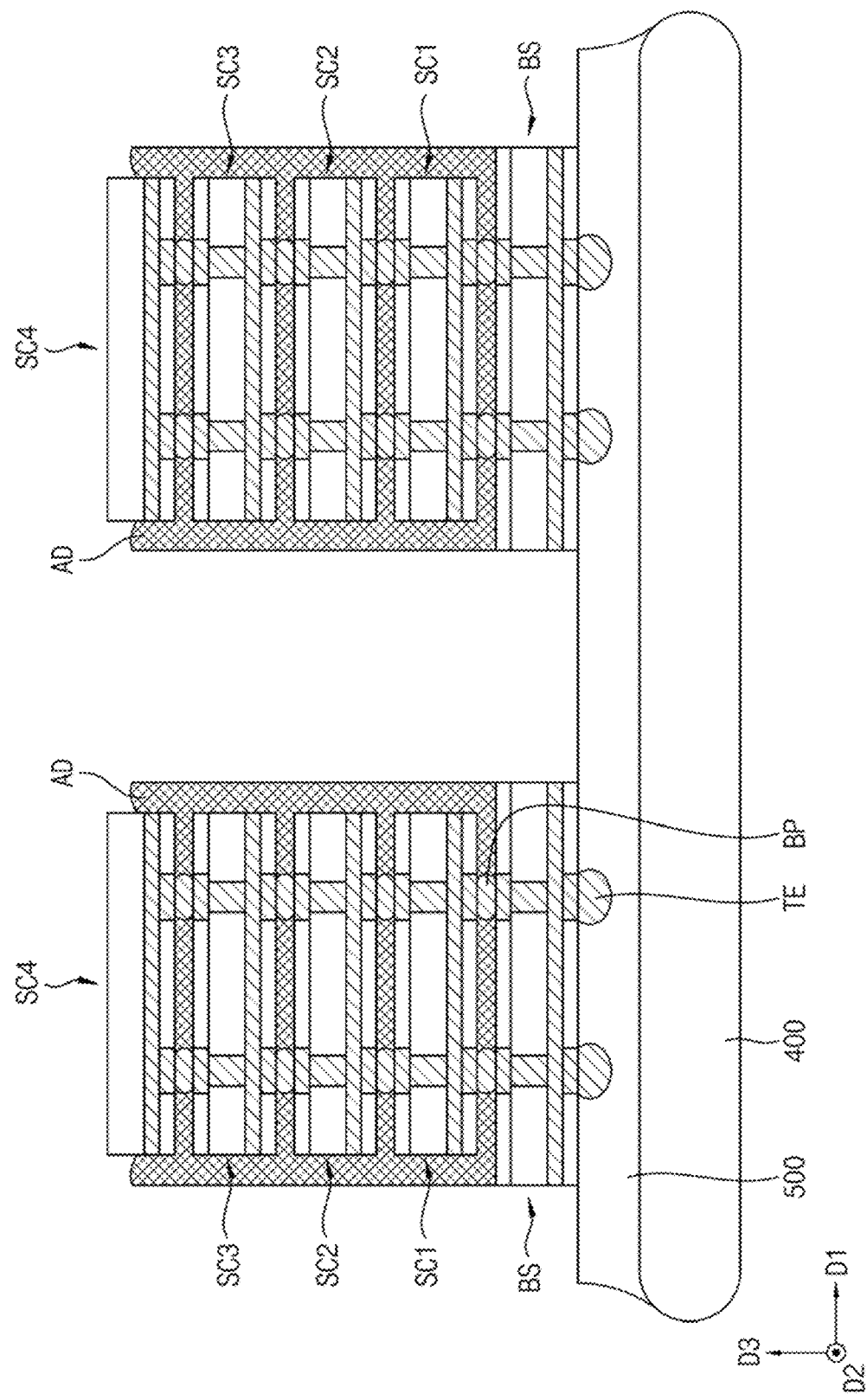

Referring to FIG. 2C, the base structures BS and the terminals TE may be detached from the first glue layer 300 on the first carrier substrate 200. Thereafter, the detached base structures BS and terminals TE may be attached to a second glue layer 500 on a second carrier substrate 400. A bottom surface of the base structure BS may contact a top surface of the second glue layer 500. The first to fourth semiconductor chips SC1, SC2, SC3 and SC4, the adhesive layers AD and the bumps BP may be disposed over the second carrier substrate 400 and the second glue layer 500.

Figure 2D:
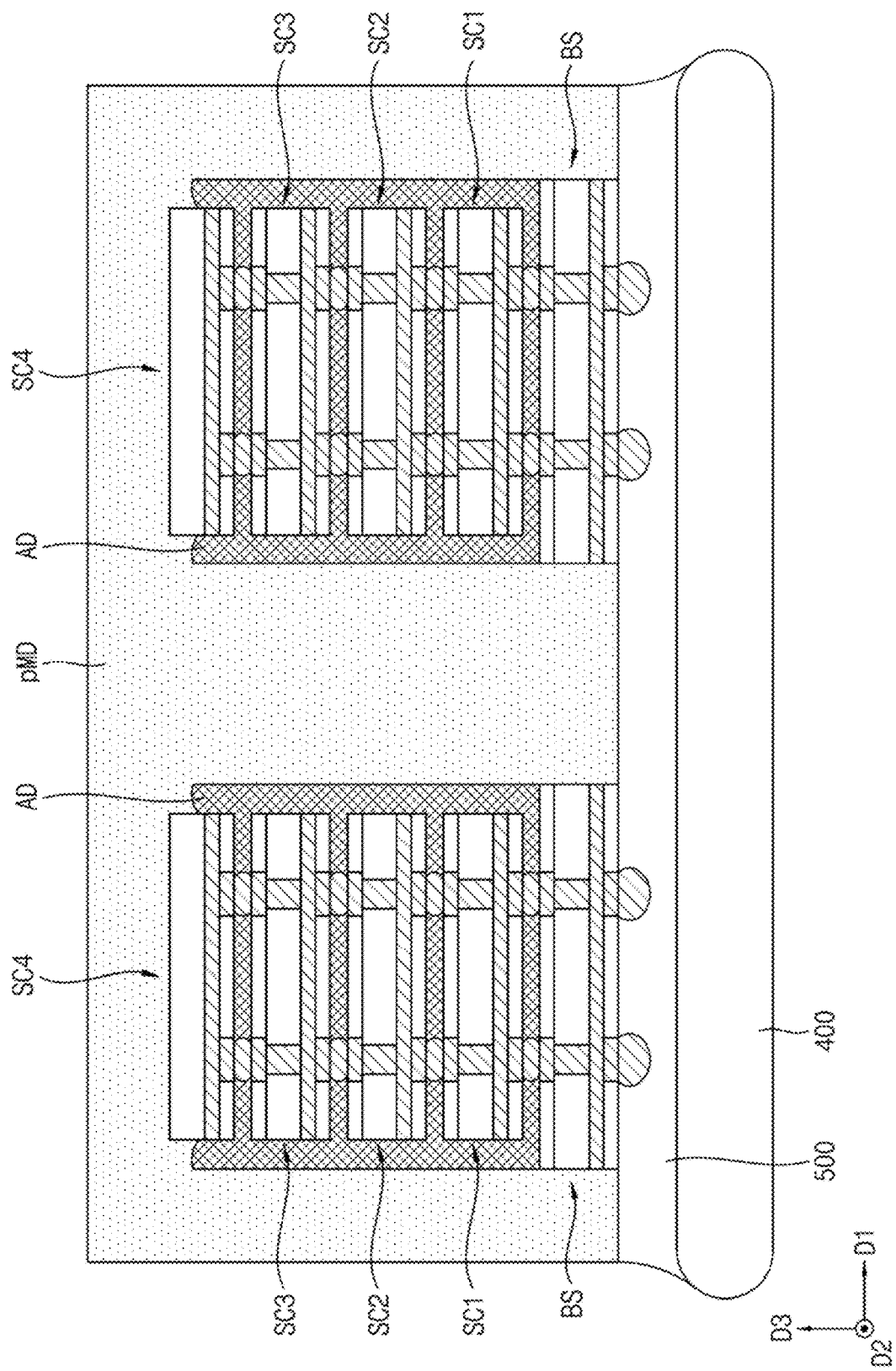

Referring to FIG. 2D, a preliminary molding layer pMD may be formed on the second glue layer 500. The preliminary molding layer pMD may surround the base structures BS, the first to fourth semiconductor chips SC1, SC2, SC3 and SC4, and the adhesive layers AD. A bottom surface of the preliminary molding layer pMD may contact the top surface of the second glue layer 500.

Figure 2E:
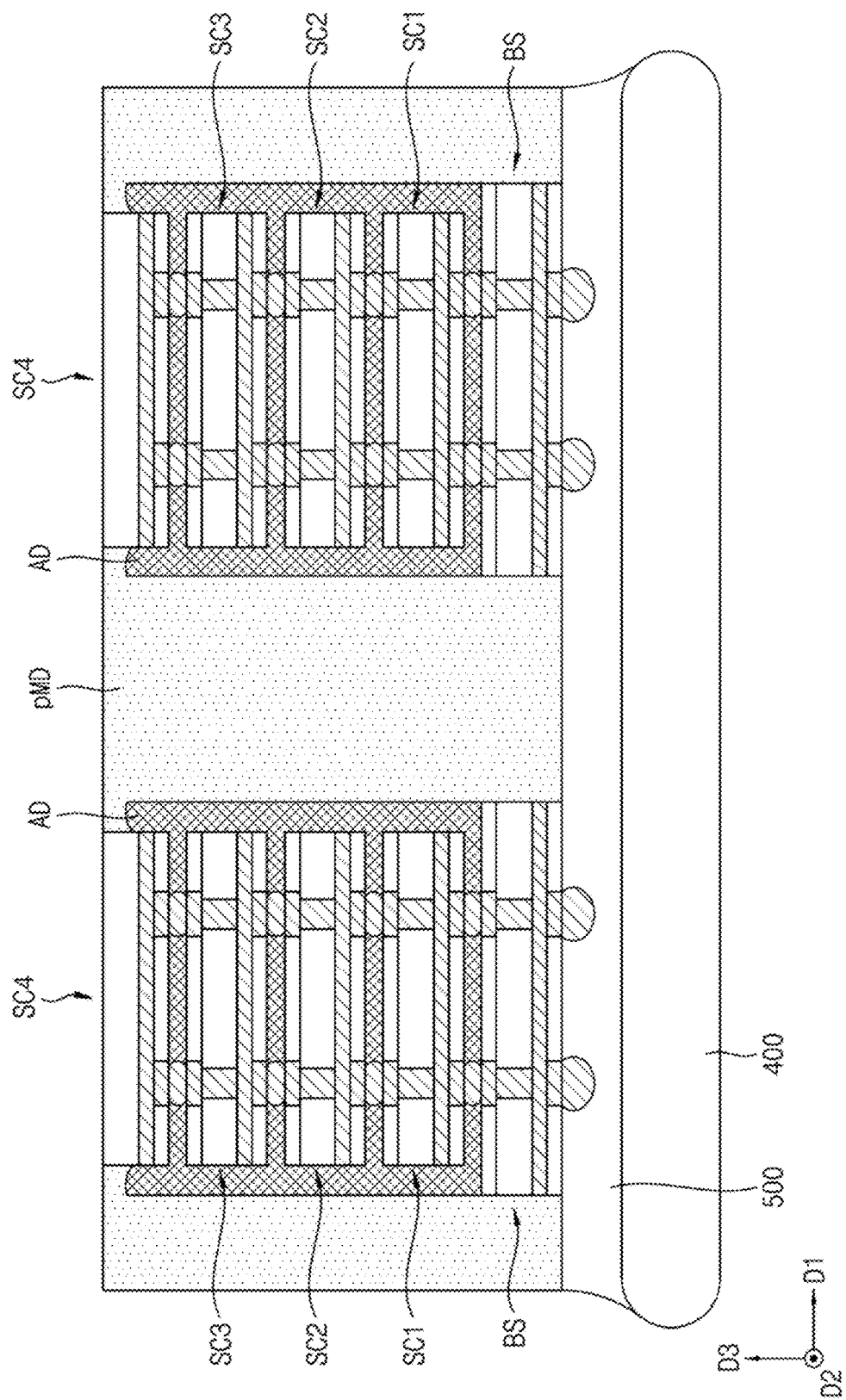

Referring to FIG. 2E, an upper portion of the preliminary molding layer pMD may be removed. For example, the upper portion of the preliminary molding layer pMD may be removed by a grinding process. As the upper portion of the preliminary molding layer pMD is removed, top surfaces of the fourth semiconductor chips SC4 (that is, uppermost semiconductor chips) may be exposed.

Figure 2F:
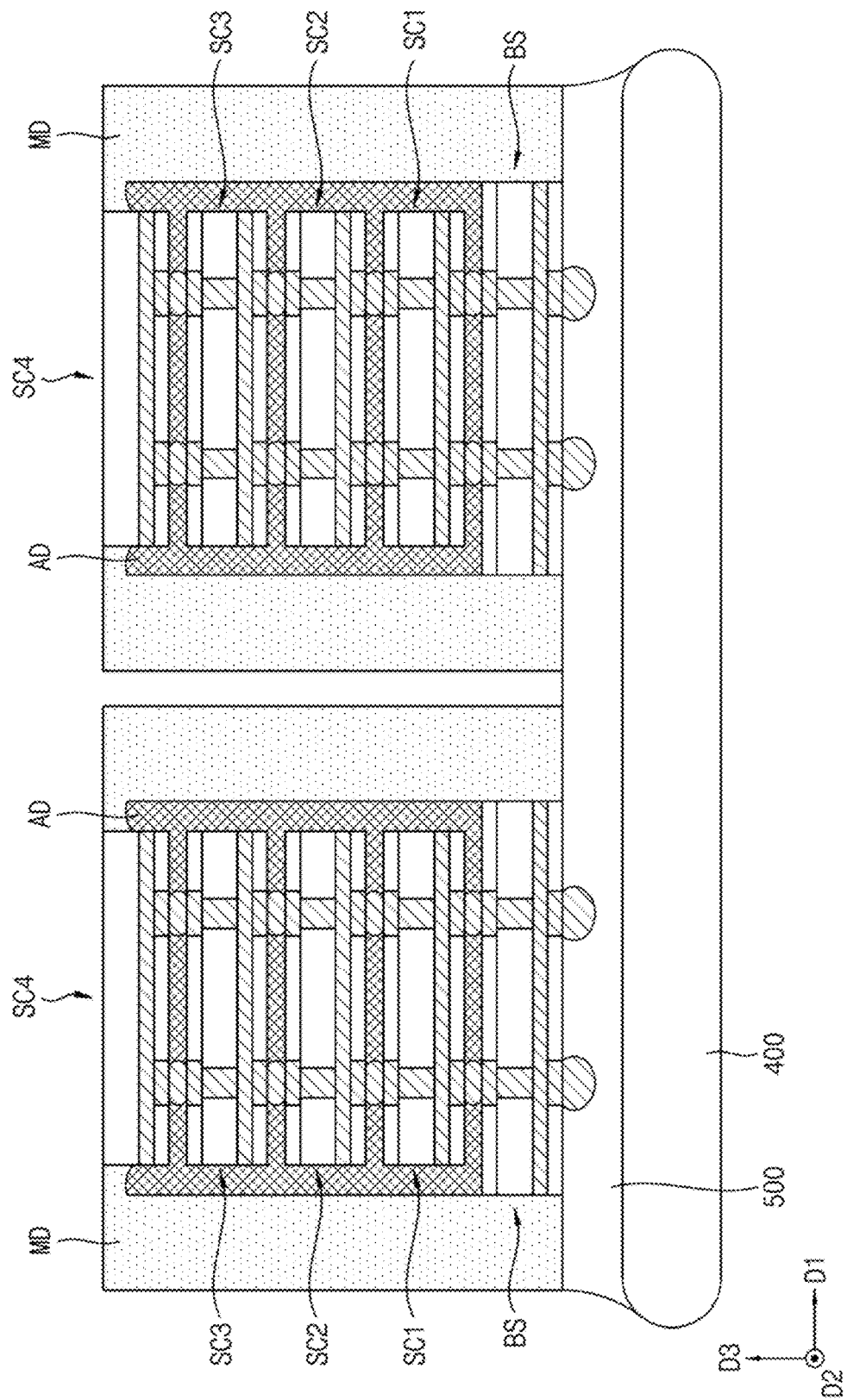

Referring to FIG. 2F, a second sawing process may be performed. For example, the second sawing process may be a blade sawing process. The second sawing process may include cutting the preliminary molding layer pMD. As the preliminary molding layer pMD is cut, molding layers MD may be formed. The preliminary molding layer pMD may be separated into a plurality of molding layers MD. A bottom surface of the molding layer MD may contact the top surface of the second glue layer 500. After formation of the molding layers MD, the base structure BS and the molding layers MD may be detached from the second glue layer 500 on the second carrier substrate 400.

In the semiconductor package manufacturing method according to example embodiments, the adhesive layer AD, which has a flat outer side surface, may be formed by cutting the preliminary adhesive layer pAD. Accordingly, it may be possible to limit and/or prevent the adhesive layer AD from being exposed in a process of cutting the preliminary molding layer pMD and, as such, formation of a crack caused by an exposed adhesive layer AD may be limited and/or prevented.

Figure 3:
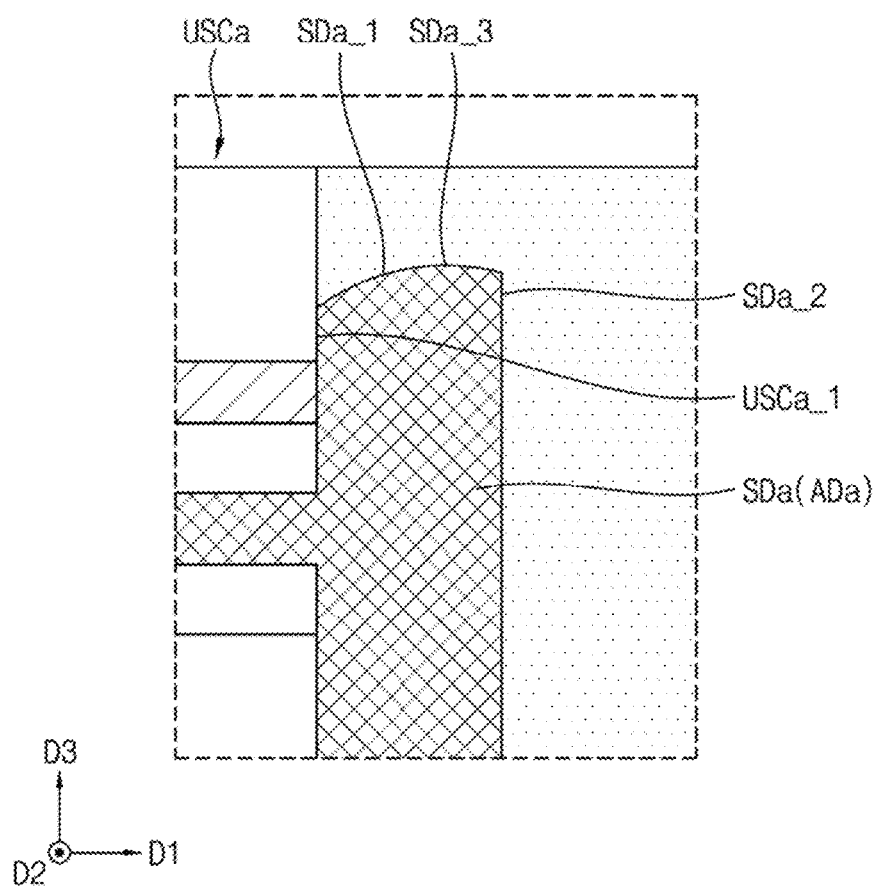
FIG. 3 is an enlarged sectional view of a portion of a semiconductor package according to some example embodiments.

FIG. 3 is an enlarged sectional view of a portion of a semiconductor package according to some embodiments.

Referring to FIG. 3, an adhesive layer ADa of the semiconductor package may include a side portion SDa. A top surface SDa_1 of the side portion SDa may contact a side surface USCa_1 of an uppermost semiconductor chip USCa. The top surface SDa_1 of the side portion SDa may be defined between the side surface USCa_1 of the uppermost semiconductor chip USCa and an outer side surface SDa_2 of the side portion SDa.

The level of the top surface SDa_1 of the side portion SDa may gradually increase as the top surface SDa_1 extends from the side surface USCa_1 of the uppermost semiconductor chip USCa to an uppermost portion SDa_3 of the side portion SDa. The level of the top surface SDa_1 of the side portion SDa may be gradually lowered as the top surface SDa_1 extends from the uppermost portion SDa_3 of the side portion SDa to the outer side surface SDa_2 of the side portion SDa. The uppermost portion SDa_3 of the side portion SDa may be a portion of the top surface SDa_1 of the side portion SDa.

Figure 4:
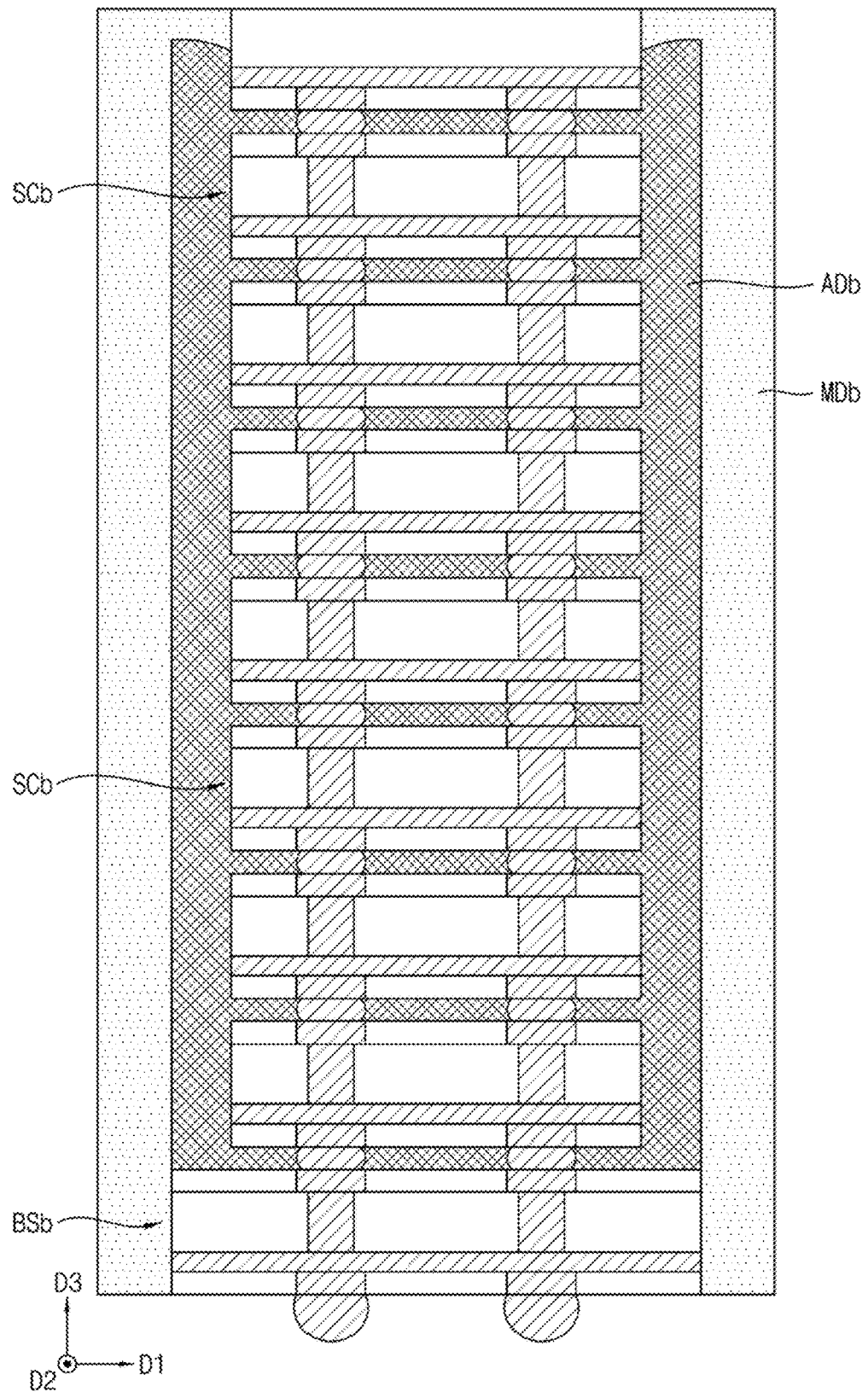
FIG. 4 is a sectional view of a semiconductor package according to some example embodiments.

FIG. 4 is a sectional view of a semiconductor package according to some example embodiments.

Referring to FIG. 4, the semiconductor package may include a base structure BSb, and semiconductor chips SCb disposed over the base structure BSb. Although the number of semiconductor chips SCb is shown as being eight, example embodiments are not limited thereto. An adhesive layer ADb, which is disposed on the base structure BSb while surrounding the semiconductor chips SCb, may be provided. A molding layer MDb, which surrounds the base structure BSb, the semiconductor chips SCb and the adhesive layer ADb, may be provided.

Figure 5:
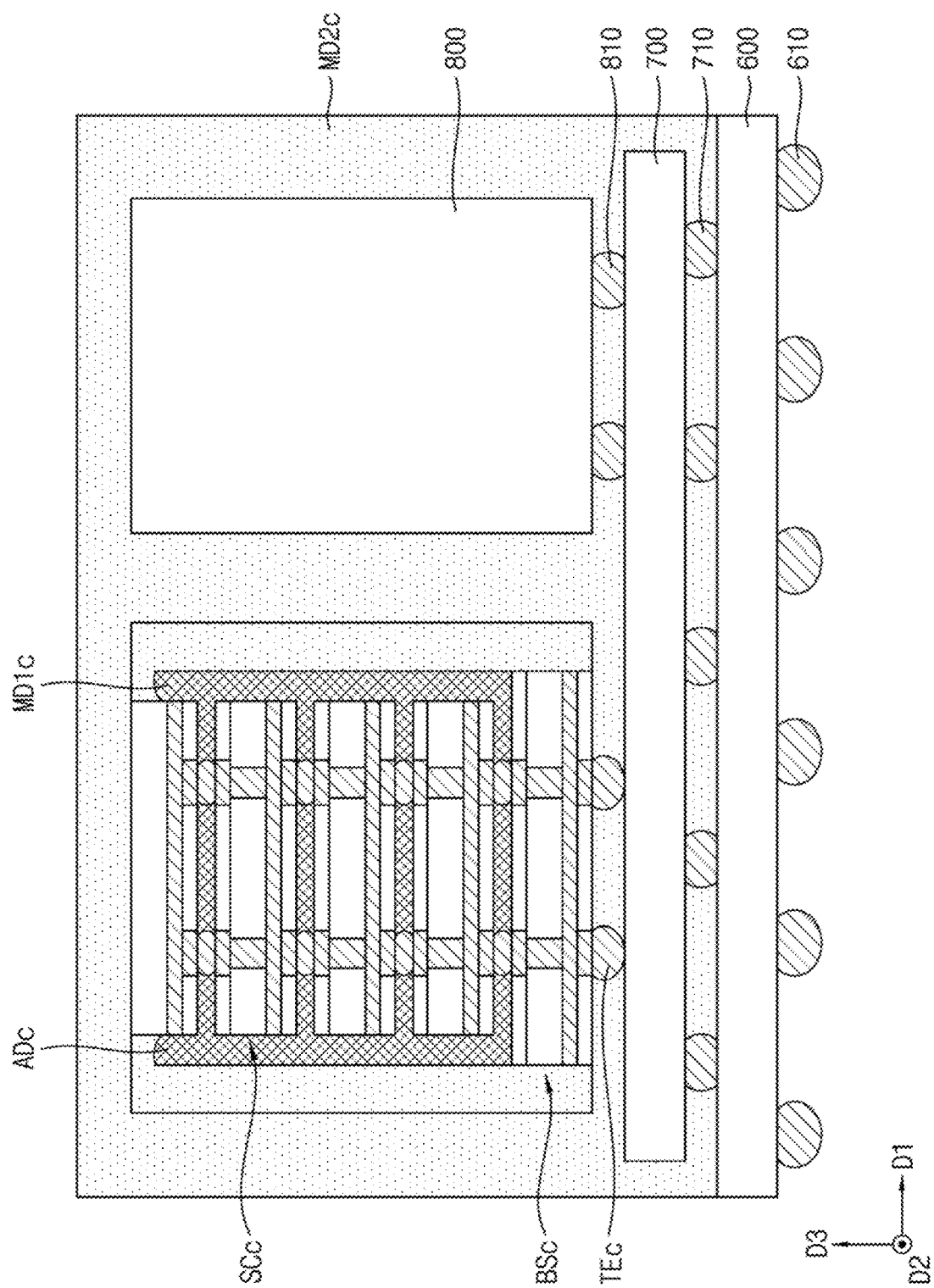
FIG. 5 is a sectional view of a semiconductor package according to some example embodiments.

FIG. 5 is a sectional view of a semiconductor package according to some example embodiments.

Referring to FIG. 5, the semiconductor package may include a package substrate 600. For example, the package substrate 600 may be a printed circuit board (PCB). First terminals 610 electrically connected to the package substrate 600 may be provided. The semiconductor package may be mounted on an external device (for example, a main board) via the first terminals 610.

An interposer 700 may be provided over the package substrate 600. Second terminals 710 electrically interconnecting the package substrate 600 and the interposer 700 may be provided. The second terminals 710 may be provided between the package substrate 600 and the interposer 700.

A processor chip 800 may be provided over the interposer 700. For example, the processor chip 800 may be a graphics processing unit (GPU) or a central processing unit (CPU). Third terminals 810 electrically interconnecting the processor chip 800 and the interposer 700 may be provided. The third terminals 810 may be provided between the processor chip 800 and the interposer 700.

A base structure BSc and semiconductor chips SCc may be provided over the interposer 700. The base structure BSc and the semiconductor chips SCc may be spaced apart from the processor chip 800 in a first direction D1. Fourth terminals TEc electrically interconnecting the base structure BSc and the interposer 700 may be provided. The fourth terminals TEc may be provided between the base structure BSc and the interposer 700.

An adhesive layer ADc surrounding the semiconductor chips SCc may be provided over the base structure BSc. A first molding layer MD1c surrounding the base structure BSc, the semiconductor chips SCc and the adhesive layer ADc may be provided.

A second molding layer MD2c surrounding the interposer 700, the processor chip 800, the base structure BSc and the semiconductor chips SCc may be provided over the package substrate 600. The second molding layer MD2c may include the same material as the first molding layer MD1c. In some embodiments, an underfill layer may be provided in at least one of a region between the package substrate 600 and the interposer 700, a region between the processor chip 800 and the interposer 700 or a region between the base structure BSc and the interposer 700.

A semiconductor package according to some example embodiments may limit and/or prevent formation of a crack caused by concentration of stress and, as such, reliability of the semiconductor package may be enhanced.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments have been described with reference to the accompanying drawings, it should be understood by those skilled in the art that various modifications may be made without departing from the scope of inventive concepts and without changing essential features thereof. Therefore, the above-described embodiments should be considered in a descriptive sense only and not for purposes of limitation.

What is claimed is:

1. A semiconductor package comprising:
   a base structure;
   a first semiconductor chip spaced apart from the base structure;
   a second semiconductor chip spaced apart from the first semiconductor chip;
   an adhesive layer including an interposition portion and a side portion,
   the interposition portion between the first semiconductor chip and the second semiconductor chip, the side portion contacting a side surface of the first semiconductor chip and a side surface of the second semiconductor chip,
   a top surface of the side portion being curved, and an outer side surface of the side portion being flat; and
   a molding layer surrounding the first semiconductor chip, the second semiconductor chip, and the adhesive layer,
   wherein
   the outer side surface of the side portion is coplanar with a side surface of the base structure.

2. The semiconductor package according to claim 1, wherein a coefficient of thermal expansion of the adhesive layer is different from a coefficient of thermal expansion of the molding layer.

3. The semiconductor package according to claim 2, wherein
   the coefficient of thermal expansion of the adhesive layer is 35 to 40 ppm/° C., and
   the coefficient of thermal expansion of the molding layer is 10 to 15 ppm/° C.

4. The semiconductor package according to claim 1, wherein:
   a bottom surface of the side portion of the adhesive layer contacts an outer portion of a top surface of the base structure; and
   the outer portion of the top surface of the base structure is connected to the side surface of the base structure.

5. The semiconductor package according to claim 1, wherein
   the molding layer comprises an inner side surface, and the inner side surface of the molding layer contacts the outer side surface of the side portion of the adhesive layer and the side surface of the base structure.

6. The semiconductor package according to claim 1, wherein a bottommost surface of the molding layer is coplanar with a bottom surface of the base structure.

7. The semiconductor package according to claim 1, wherein a width of the side portion of the adhesive layer is 50 μm.

8. A semiconductor package comprising:
a base structure;
a first bump connected to the base structure;
a first semiconductor chip connected to the first bump;
an adhesive layer including a first interposition portion and a side portion, the first interposition portion between the base structure and the first semiconductor chip, and the side portion contacting a top surface of the base structure and a side surface of the first semiconductor chip; and
a molding layer surrounding the base structure, the first semiconductor chip, and the adhesive layer,
a level of a bottom surface of the molding layer being equal to a level of a bottom surface of the base structure.

9. The semiconductor package according to claim 8, wherein a width of the base structure is greater than a width of the first semiconductor chip.

10. The semiconductor package according to claim 8, wherein an inner side surface of the molding layer contacts an outer side surface of the side portion of the adhesive layer and a side surface of the base structure.

11. The semiconductor package according to claim 8, further comprising:
a second bump connected to the first semiconductor chip; and
a second semiconductor chip connected to the second bump,
wherein the adhesive layer further comprises a second interposition portion between the first semiconductor chip and the second semiconductor chip.

12. The semiconductor package according to claim 8, further comprising:
an uppermost semiconductor chip over the first semiconductor chip,
wherein the molding layer exposes a top surface of the uppermost semiconductor chip.

13. The semiconductor package according to claim 12, wherein a top surface of the molding layer is coplanar with the top surface of the uppermost semiconductor chip.

14. A semiconductor package comprising:
semiconductor chips overlapping each other, the semiconductor chips including an uppermost semiconductor chip;
an adhesive layer including interposition portions and a side portion,
the interposition portions between the semiconductor chips, and
the side portion connected to the interposition portions, and
a level of a top surface of the side portion of the adhesive layer gradually increases as the top surface of the side portion of the adhesive layer extends from a side surface of the uppermost semiconductor chip to an uppermost portion of the side portion of the adhesive layer; and
a molding layer surrounding the semiconductor chips and the adhesive layer.

15. The semiconductor package according to claim 14, wherein the uppermost portion of the side portion of the adhesive layer is spaced apart from the side surface of the uppermost semiconductor chip.

16. The semiconductor package according to claim 14, wherein
the top surface of the side portion of the adhesive layer is curved, and
an outer side surface of the side portion of the adhesive layer is flat.

17. The semiconductor package according to claim 14, wherein
an outer side surface of the side portion of the adhesive layer extends in a vertical direction, and
the level of the top surface of the side portion of the adhesive layer gradually lowers as the top surface of the side portion of the adhesive layer extends from the uppermost portion of the side portion of the adhesive layer to the outer side surface of the side portion of the adhesive layer.

18. The semiconductor package according to claim 14, further comprising:
a base structure electrically connected to the semiconductor chips,
wherein an entirety of a side surface of the base structure contacts the molding layer.

19. The semiconductor package according to claim 18, wherein a bottom surface of the base structure is coplanar with a bottom surface of the molding layer.

* * * * *